United States Patent
Schwarz et al.

(10) Patent No.: US 9,608,172 B2
(45) Date of Patent: Mar. 28, 2017

(54) OPTOELECTRONIC SEMICONDUCTOR COMPONENT

(71) Applicant: OSRAM Opto Semiconductors GmbH, Regensburg (DE)

(72) Inventors: Thomas Schwarz, Regensburg (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 162 days.

(21) Appl. No.: 14/441,458

(22) PCT Filed: Nov. 4, 2013

(86) PCT No.: PCT/EP2013/072946
§ 371 (c)(1),
(2) Date: May 7, 2015

(87) PCT Pub. No.: WO2014/072256
PCT Pub. Date: May 15, 2014

(65) Prior Publication Data
US 2015/0295141 A1    Oct. 15, 2015

(30) Foreign Application Priority Data

Nov. 9, 2012 (DE) .......................... 10 2012 110 774

(51) Int. Cl.
*H01L 33/50* (2010.01)
*H01L 33/48* (2010.01)
*H01L 33/60* (2010.01)
*H01L 33/62* (2010.01)
*H05K 1/02* (2006.01)
(Continued)

(52) U.S. Cl.
CPC .......... *H01L 33/483* (2013.01); *H01L 33/486* (2013.01); *H01L 33/60* (2013.01);
(Continued)

(58) Field of Classification Search
None
See application file for complete search history.

(56) References Cited

U.S. PATENT DOCUMENTS 6,995,029 B2 * 2/2006 Sorg ................... H01L 21/4846
257/100
7,300,182 B2   11/2007 Mazzochette
(Continued)

FOREIGN PATENT DOCUMENTS

DE   112005003345 T5   11/2007
DE   102010027253 A1   1/2012
WO   2005067063 A1    7/2005

OTHER PUBLICATIONS

"Miro-Silver: When each reflection counts," ALANOD, www.alanod.com, Feb. 2012, 8 pages.

*Primary Examiner* — Michael Lebentritt
(74) *Attorney, Agent, or Firm* — Slater Matsil, LLP

(57) ABSTRACT

In at least one embodiment, the optoelectronic semiconductor component contains at least one chip support having electrical contact devices and also at least one optoelectronic semiconductor chip that is set up to produce radiation and that is mechanically and electrically mounted on the chip support. A component support is attached to the chip support. The semiconductor chip is situated in a recess in the component support. The component support is electrically insulated from the chip support and from the semiconductor chip. The component support is formed from a metal or from a metal alloy. On a top that is remote from the chip support, the component support is provided with a reflective coating.

17 Claims, 2 Drawing Sheets

(51) Int. Cl.
*H01L 25/075* (2006.01)
*H01L 33/64* (2010.01)

(52) U.S. Cl.
CPC .............. *H01L 33/62* (2013.01); *H01L 33/64* (2013.01); *H05K 1/021* (2013.01); *H01L 25/0753* (2013.01); *H01L 33/642* (2013.01); *H01L 2224/48091* (2013.01); *H01L 2224/73265* (2013.01); *H05K 2201/09745* (2013.01); *H05K 2201/10106* (2013.01); *H05K 2201/2054* (2013.01)

(56) References Cited

U.S. PATENT DOCUMENTS

| | | | |
|---|---|---|---|
| 8,860,062 | B2 | 10/2014 | Schneider et al. |
| 2004/0079957 | A1 | 4/2004 | Andrews et al. |
| 2008/0203416 | A1 | 8/2008 | Konishi et al. |
| 2011/0309404 | A1 | 12/2011 | Lee |
| 2012/0314393 | A1* | 12/2012 | Leib ........................ H01L 24/97 361/809 |
| 2014/0034983 | A1* | 2/2014 | Gebuhr ................... H01L 33/54 257/98 |
| 2014/0183591 | A1* | 7/2014 | Jow ................... H01L 27/14618 257/99 |
| 2015/0016107 | A1* | 1/2015 | Wimmer ................. H01L 33/60 362/235 |
| 2015/0303353 | A1* | 10/2015 | Herrmann ............. H01L 33/486 257/99 |
| 2016/0149101 | A1* | 5/2016 | Singer .................. G02B 6/0021 257/98 |
| 2016/0163932 | A1* | 6/2016 | Brandl ................. H01L 33/505 438/29 |
| 2016/0300985 | A1* | 10/2016 | Gootz .................... C09K 11/02 |

* cited by examiner

OPTOELECTRONIC SEMICONDUCTOR COMPONENT

This patent application is a national phase filing under section 371 of PCT/EP2013/072946, filed Nov. 4, 2013, which claims the priority of German patent application 10 2012 110 774.2, filed Nov. 9, 2012, each of which is incorporated herein by reference in its entirety.

TECHNICAL FIELD

An optoelectronic semiconductor component is specified.

SUMMARY

Embodiments of the invention specify a semiconductor component wherein an optoelectronic semiconductor chip is thermally and electrically efficiently connected.

In accordance with at least one embodiment, the semiconductor component comprises one or a plurality of chip carriers. The chip carrier is a circuit board, for example. By way of example, the chip carrier is shaped from a board, in particular a metal core board.

In accordance with at least one embodiment, the chip carrier comprises electrical contact devices. The electrical contact devices are embodied, for example, as conductor tracks or as electrical contact areas, for instance for fitting external electrical contacts by means of soldering.

In accordance with at least one embodiment, the semiconductor component comprises one or a plurality of optoelectronic semiconductor chips. The at least one semiconductor chip is designed for generating radiation during the operation of the semiconductor component. By way of example, the semiconductor chip generates ultraviolet radiation, visible light and/or near-infrared radiation during operation. The semiconductor chip is preferably a light emitting diode or a laser diode.

In accordance with at least one embodiment, the at least one optoelectronic semiconductor chip is mechanically and electrically fitted on the at least one chip carrier. Mechanically fitted can mean that the semiconductor chip does not detach from the chip carrier during intended use of the semiconductor component. The at least one optoelectronic semiconductor chip is energizable and electrically drivable via the chip carrier, in particular exclusively via the chip carrier.

In accordance with at least one embodiment, the semiconductor component comprises one or a plurality of component carriers. The at least one component carrier is fixed to the chip carrier, such that the component carrier does not detach from the chip carrier during intended use. The component carrier preferably does not touch the at least one semiconductor chip. The component carrier can be a single, mechanically continuous unit, and so can the chip carrier.

In accordance with at least one embodiment, the semiconductor chip is situated in a cutout of the component carrier. In particular, the semiconductor chip is surrounded all around by a material of the component carrier in a closed line.

In accordance with at least one embodiment, the component carrier is electrically insulated from the chip carrier and the semiconductor chip. There is then no short circuit between the component carrier and the chip carrier or the semiconductor chip during intended use of the semiconductor component.

In accordance with at least one embodiment, the component carrier is shaped from a metal or a metal alloy. By way of example, the component carrier is an aluminum film or an aluminum plate. A steel plate or a high-grade steel plate can likewise be used. A plastic film, filled or highly filled with an admixture in order to achieve a high thermal conductivity, can also be used, particularly if the component carrier is used for cooling and/or as a heat sink.

In accordance with at least one embodiment, the component carrier is provided with a reflective coating at least at a top side facing away from the chip carrier. The reflective coating is, for example, an aluminum layer, a silver layer or a so-called Bragg mirror comprising a layer sequence comprising layers having alternately high and low refractive indices. The entire top side of the component carrier can be provided with the reflective coating, or else only a portion, for example, at least 50% or at least 75%.

The term reflective coating can mean that a reflectivity for radiation emitted by the semiconductor chip, for example, averaged over the relevant spectral range, is at least 90% or at least 93% or at least 95%. By means of the reflective coating, a reflectivity of the component carrier, in comparison with a base material of the component carrier, is increased, for example, by at least five percentage points or by at least eight percentage points.

In at least one embodiment, the optoelectronic semiconductor component comprises at least one chip carrier having electrical contact devices, and at least one optoelectronic semiconductor chip which is designed for generating radiation and which is mechanically and electrically fitted on the chip carrier. A component carrier is fixed to the chip carrier. The semiconductor chip is situated in a cutout of the component carrier. The component carrier is electrically insulated from the chip carrier and the semiconductor chip. The component carrier is shaped from a metal or metal alloy. At a top side facing away from the chip carrier, the component carrier is provided with a reflective coating.

A series of requirements are made of a mounting platform for an optoelectronic semiconductor chip, in particular for light emitting diode chips. In this regard, an electrical wiring is to be made possible; in particular, an anode, a cathode and optionally protection against damage as a result of electrostatic discharges are to be realized. Furthermore, a thermal linking to a heat sink with the lowest possible thermal resistance is striven for. By means of optical elements which are fitted to the mounting platform or which are formed by the mounting platform, it is possible to obtain a high light coupling-out efficiency out of the component, preferably with a defined emission characteristic. Furthermore, cost-effective materials and production processes are preferred.

Some possibilities for providing a mounting platform for light emitting diode chips consist in encapsulating a leadframe by molding, and mounting a light emitting diode chip into a cutout of this potting and providing the cutout with a further potting material. One possibility for creating a mounting platform likewise consists in providing a ceramic carrier, for instance on the basis of aluminum oxide or aluminum nitride, with a semiconductor chip and fitting a potting thereon. A light emitting diode chip and a potting body, for instance shaped as a lens, can likewise be fitted on metal core boards. Moreover, reflective carriers can be used, particularly in the case of light emitting diode chips having a radiation-transmissive substrate, for instance composed of sapphire.

In the case of the semiconductor component specified, the reflective component carrier is used, in the cutouts of which semiconductor chips are fitted. The chip carrier used is preferably a printed circuit board, PCB for short, a metal core board, MCB for short, a flexible circuit board, a so-called QFN or quad flat no leaded package, or a ceramic carrier.

In accordance with at least one embodiment, the component carrier, in a direction away from the chip carrier, projects beyond the semiconductor chip. In particular, the component carrier projects beyond the semiconductor chip all around.

In accordance with at least one embodiment, the at least one semiconductor chip is fitted directly to the chip carrier. This can mean that just a connecting medium such as an adhesive or a solder is situated between the semiconductor chip and the chip carrier.

In accordance with at least one embodiment, no additional reflective layer is situated between the semiconductor chip and the chip carrier. In other words, the chip carrier is then not provided with a reflective coating, for instance composed of aluminum or composed of silver. A chip mounting side facing the semiconductor chip then has a comparatively low reflectivity. By way of example, the semiconductor chip is fitted directly on conductor tracks or on electrical contact areas composed of copper or composed of a copper alloy. A reflectivity of the chip mounting side of the chip carrier, particularly for blue light approximately at 480 nm, is then, for example, at most 85% or at most 75%.

In accordance with at least one embodiment, the component carrier is adhesively bonded onto the chip carrier. An electrical insulation between the component carrier and the chip carrier can be realized by means of an adhesive connection. Alternatively, it is possible for a connection free of connecting medium to be present between the component carrier and the chip carrier, for instance by means of molding by means of injection or pressing or by a connecting technique such as friction welding.

In accordance with at least one embodiment, the component carrier and the chip carrier have boundary surfaces which face one another and which are shaped in a level and planar fashion within the scope of the production tolerances. In particular, the component carrier and the chip carrier do not mutually penetrate through one another and do not intermesh in one another. No toothing is then formed between the component carrier and the chip carrier.

For many applications, a specific electrical breakdown strength is required for the electrical insulation between the component carrier and the chip carrier. In the case of adhesives, one risk is that said breakdown strength cannot be guaranteed absolutely at all adhesive joints on account of thickness fluctuations or shrink holes. In order to improve the breakdown strength, the component carrier or/and the chip carrier can be provided with a dielectric coating before the component carrier and the chip carrier are joined together.

In accordance with at least one embodiment, the component carrier has a thickness of at least 100 μm or of at least 150 μm. Alternatively or additionally, the thickness of the component carrier is at most 750 μm or at most 500 μm or at most 350 μm. The component carrier can therefore be designed to be comparatively thin. It is possible for the component carrier to consist of the metallic base material and the reflective coating and to comprise no further component parts.

In accordance with at least one embodiment, the thickness of the chip carrier is at least 200 μm or at least 500 μm. Alternatively or additionally, the thickness of the chip carrier is at most 5 mm or at most 3 mm or at most 1.5 mm.

In accordance with at least one embodiment, exactly one semiconductor chip is situated in the cutout or in at least one of the cutouts of the component carrier. If a plurality of cutouts are present, then preferably each of the cutouts is equipped with exactly one of the semiconductor chips.

In accordance with at least one embodiment, a side wall of the cutout is at a distance from the semiconductor chip of at most 250 μm or of at most 150 μm or of at most 100 μm. In other words, a size of the cutout, as seen in plan view, is similar to a size of the semiconductor chip. The distance is determined in particular at the and in a plane with the chip mounting side. The cutout can be at the specified distance from the semiconductor chip completely circumferentially, as seen in plan view.

In accordance with at least one embodiment, the semiconductor component comprises a plurality of the chip carriers. Each of the chip carriers is then provided with one or a plurality of the optoelectronic semiconductor chips. The semiconductor chips preferably all face in the same direction and have the same main emission direction within the scope of the production tolerances.

In accordance with at least one embodiment, the chip carriers are mechanically connected to one another by means of the exactly one component carrier and are fitted to the exactly one component carrier.

In accordance with at least one embodiment, the plurality of chip carriers within the semiconductor component are electrically connected to one another. Corresponding electrical connections can be placed at the component carrier. In this case, the semiconductor component can comprise exactly two contact areas for external electrical contacting. It is possible that the chip carriers are to be electrically contacted not individually and not independently of one another.

In accordance with at least one embodiment, the cutout in which the semiconductor chip is situated is partly or completely filled with one or a plurality of fillings. The fillings can be a matrix material, for instance composed of a silicone or an epoxide, into which particles for setting optical properties are preferably added. If a plurality of fillings are present, this can apply to all the fillings or to at least one of the fillings.

In accordance with at least one embodiment, side surfaces of the semiconductor chip that face the component carrier and/or side surfaces of the component carrier that face the semiconductor chip are covered by the filling or fillings partly or over the whole area. An interspace between the semiconductor chip and the component carrier can be completely filled by the at least one filling, as seen in plan view. The filling can extend continuously from the component carrier to the semiconductor chip. The filling can surround the semiconductor chip all around and continuously, as seen in a plan view of the top surface.

In accordance with at least one embodiment, the filling or at least one of the fillings is designed to be radiation-nontransmissive. Preferably, the filling is shaped in a reflective fashion. The filling can appear white to an observer.

In accordance with at least one embodiment, the filling or at least one of the fillings extends in a direction away from the chip carrier at least as far as half of the semiconductor chip. In particular, the filling can extend as far as a radiation main side of the semiconductor chip facing away from the chip carrier. The filling or at least one of the fillings preferably does not cover the radiation main side of the semiconductor chip.

In accordance with at least one embodiment, the electrical contact device of the chip carrier comprises one or a plurality of conductor tracks. The at least one conductor track or at least one of the conductor tracks is situated in places or else completely between the chip carrier and the component carrier. It is possible for the conductor track and/or the electrical contact device not to touch the component carrier. In particular, the adhesive connection is situated between the electrical contact device and the component carrier.

In accordance with at least one embodiment, the semiconductor component comprises one or a plurality of plugs. The at least one plug is designed for external electrical and/or mechanical contacting of the semiconductor component.

In accordance with at least one embodiment, the plug is situated at a component mounting side of the chip carrier facing away from the component carrier or at at least one of the chip carriers. By means of such a plug, the semiconductor component is electrically and/or mechanically efficiently mountable onto an external carrier.

In accordance with at least one embodiment, the component part which carries the semiconductor component is the component carrier. In other words, the component carrier is then the component part which mechanically supports and stabilizes the semiconductor component. The component carrier is then preferably mechanically self-supporting and the component carrier and hence the semiconductor component preferably do not bend or do not significantly bend during intended use. In this case, it is possible that the semiconductor component is not mechanically stable without the component carrier.

The same can correspondingly hold true if, instead of the component carrier, the chip carrier is the component part which carries the semiconductor component.

In accordance with at least one embodiment, the component carrier projects beyond the chip carrier in places or all around, as seen in a plan view of the top side. An average diameter of the component carrier can then be greater than an average diameter of the chip carrier. This can correspondingly hold true conversely, such that the chip carrier then projects beyond the component carrier in places or all around. As an alternative thereto, the component carrier and the chip carrier can terminate flush in a lateral direction, such that the component carrier and the chip carrier then have identical lateral dimensions within the scope of the production tolerances and are congruent, for example.

BRIEF DESCRIPTION OF THE DRAWINGS

An optoelectronic semiconductor component described here is explained in greater detail below on the basis of exemplary embodiments with reference to the drawing. In this case, identical reference signs indicate identical elements in the individual figures. Relations to scale are not illustrated in this case, however; rather, individual elements may be illustrated with an exaggerated size in order to afford a better understanding.

In the figures.

DETAILED DESCRIPTION OF ILLUSTRATIVE EMBODIMENTS

Figure 1:
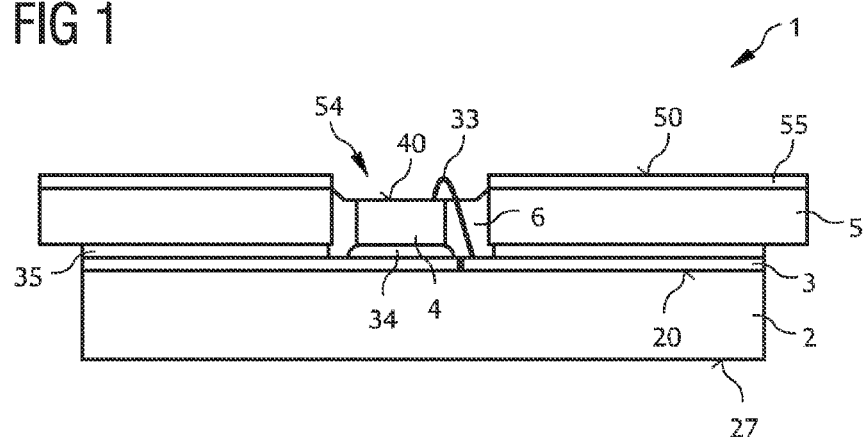
FIGS. 1 to 5 show schematic sectional illustrations of exemplary embodiments of optoelectronic semiconductor components described here.

FIG. 1 illustrates one exemplary embodiment of an optoelectronic semiconductor component 1. The semiconductor component 1 comprises a chip carrier 2 having a component mounting side 27 and having a chip mounting side 20. Electrical contact devices 3 in the form of conductor tracks are situated at the chip mounting side 20. An optoelectronic semiconductor chip 4, preferably a light emitting diode chip, is mechanically and electrically fixed to the chip carrier 2 by means of a chip connecting medium 34. A bonding wire 33 extends to the electrical contact device 3 from a radiation main side 40 of the semiconductor chip 4 facing away from the chip carrier 2.

The semiconductor chip 4 is situated in a cutout 54 of a component carrier 5. A reflective coating 55 is fitted to a top side 50 of the component carrier 5 facing away from the chip carrier 2.

In the cutout 54, the semiconductor chip 4 is surrounded all around by a filling 6, in a plan view of the top side 50, said filling extending in a direction away from the chip carrier 2 as far as firstly the radiation main side 40 and secondly the top side 50 of the component carrier 5 and integrally surrounding the semiconductor chip 4 all around.

The component carrier 5 is fixed to the same side of the chip carrier 2 as the semiconductor chip 4 by means of a carrier connecting medium 35, preferably an adhesive. The chip carriers 2 and/or the component carriers 5 are designed to be in each case flat and plate-shaped or laminar. The main sides of the chip carrier 2 and of the component carrier 5 run in each case in one plane and are oriented approximately parallel to one another.

The chip connecting medium 34 is a solder or an adhesive, for example. A gold-gold-interconnect, or GGI for short, can likewise be used, especially if the semiconductor chip is a flip-chip. A planar contacting or ribbon bonding can also be used instead of the bonding wire 33. The semiconductor chips 4 are preferably tested after being fitted on the chip carrier 2. If a plurality of the semiconductor chips 4 are applied on a carrier assemblage, then it is possible for the carrier assemblage to be singulated to form the individual chip carriers 2 in particular after testing.

The cutouts 54 in the component carrier 5 are produced, for example, by material-removing processing such as milling or grinding, by erosion, stamping, etching or laser processing. The reflective coating 55 is fitted to the top side 50, for example, by means of physical vapor deposition, or PVD for short. The reflective coating 55 can consist of aluminum or silver or comprise these metals. The reflective coating 55 can also comprise a dielectric corrosion protection or an antireflexion coating. Preferably, the component carrier 5 is a metal plate, specifically an aluminum plate, for example, having a thickness of approximately 200 µm, onto which a thin, reflective and smooth silver layer or aluminum layer is vapor-deposited.

The carrier connecting medium 35 is preferably an adhesive, which can be used to compensate for different coefficients of thermal expansion of the chip carrier 2 and of the component carrier 5 relative to one another. The component carrier 5 can also serve as a heat sink. Heat is then dissipated from the semiconductor chip 4 at least additionally via the electrical contact device 3 toward the component carrier 5 and subsequently in a lateral direction away from the semiconductor chip 4. In order to ensure a sufficient heat dissipation in particular to surrounding air, an area of the component carrier 5 can be larger than an area of the chip carrier 2, as seen in plan view. For example, the component carrier 5 is larger than the chip carrier 2 by at least a factor of 1.5 or at least a factor of 2 or at least a factor of 4. The carrier connecting medium 35 is an electrically insulating thermally conductive adhesive, in particular. In addition to the carrier connecting medium 35, an additional, electrically insulating layer, for instance a lacquer layer in particular comprising a solder resist, can be employed.

In contrast to the illustration shown, it is possible that an emission characteristic can be set in a targeted manner by means of the reflective coating 55. This can be achieved by the component carrier 5 having a non-planar top side 50, in contrast to the illustration shown in FIG. 1.

The filling 6 is, for example, a silicone filled with titanium dioxide particles, for instance, for improving coupling-out of light and in order to prevent radiation which is emitted by the semiconductor chip 4 and which emerges laterally from the semiconductor chip 4 from reaching side surfaces of the component carrier 5 in the cutout 54 which face the semiconductor chip 4 and which are not provided with a reflective coating.

By virtue of the reflective coating 55, an increased luminous flux and an increased light coupling-out efficiency can be obtained in the case of the semiconductor component 1. Since electrical conductor tracks and electrical contact devices 3 are situated at the chip carrier 2 and not at the component carrier 5, the component carrier 5 can have a high reflectivity especially at the top side 50. A cost saving can be obtained on account of the use of the component carrier 5 as a heat sink and for light shaping. A cost saving can likewise be achieved by the use of printed circuit boards for the chip carrier 2 for instance instead of metal core boards or ceramics.

Figure 2:
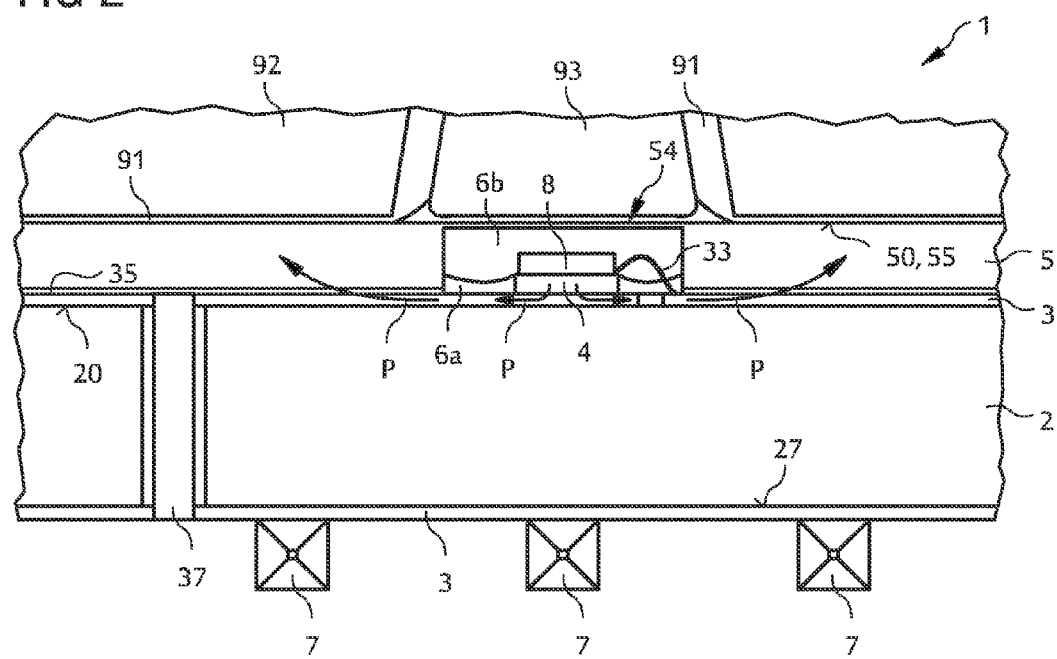

A further exemplary embodiment of the semiconductor component 1 is shown in FIG. 2. A plurality of plugs 7 for external electrical and mechanical contacting of the semiconductor component 1 are situated at the component mounting side 27. Via an electrical plated-through hole 37 through the chip carrier 2, conductor tracks 3 at the component mounting side 27 are electrically connected to conductor tracks 3 at the chip mounting side 20. Heat conducting paths P run via the conductor tracks 3 at the chip mounting side 20 toward the component carrier 5. The chip carrier 2 is a printed circuit board.

A conversion medium body 8, for example, a ceramic lamina, for instance for generating green light, is disposed downstream of the semiconductor chip 4 in a direction away from the chip carrier 2. Near to the chip carrier 2, the semiconductor chip 4 is surrounded all around preferably by the reflective optional first filling 6a that appears white. In the direction away from the chip carrier 2, the optional first filling 6a is followed by a preferably transparent, radiation-transmissive second filling 6b, which can completely embed the semiconductor chip 4, the conversion medium body 8 and also the bonding wire 33 together with the optional first filling 6a. The second filling 6b can be free of admixtures such as scattering particles.

A radiation mixer 92 and a radiation extractor 93 are optionally disposed downstream of the semiconductor chip 4 and the component carrier 5, in a direction away from the chip carrier 2. These components parts can also be present in all the other exemplary embodiments. Respective gaps 91 are optionally situated between the radiation mixer 92, the radiation extractor 93, the second filling 6b and the component carrier 5. An optical connecting medium can be situated between the second filling 6b and the radiation extractor 93 and can be used to fit the radiation extractor 93 to the filling 6b. A sudden change in refractive index between the filling 6b and the radiation extractor 93 can be reduced or avoided by means of the optical connecting medium.

In contrast to the illustration shown, a plurality of the semiconductor chips 4 can be fitted to the chip carrier 2, in a single cutout 54 or in a plurality of cutouts 54, such that in particular a red-green-blue module, RGB module for short, can be realized.

As also in all the other exemplary embodiments, the semiconductor component 1 preferably comprises a protective diode for protection against damage as a result of electrostatic discharges, respectively not depicted. If a plurality of electrically separately drivable semiconductor chips 4 are present, then a plurality of such protective diodes can also be used.

Figure 3:
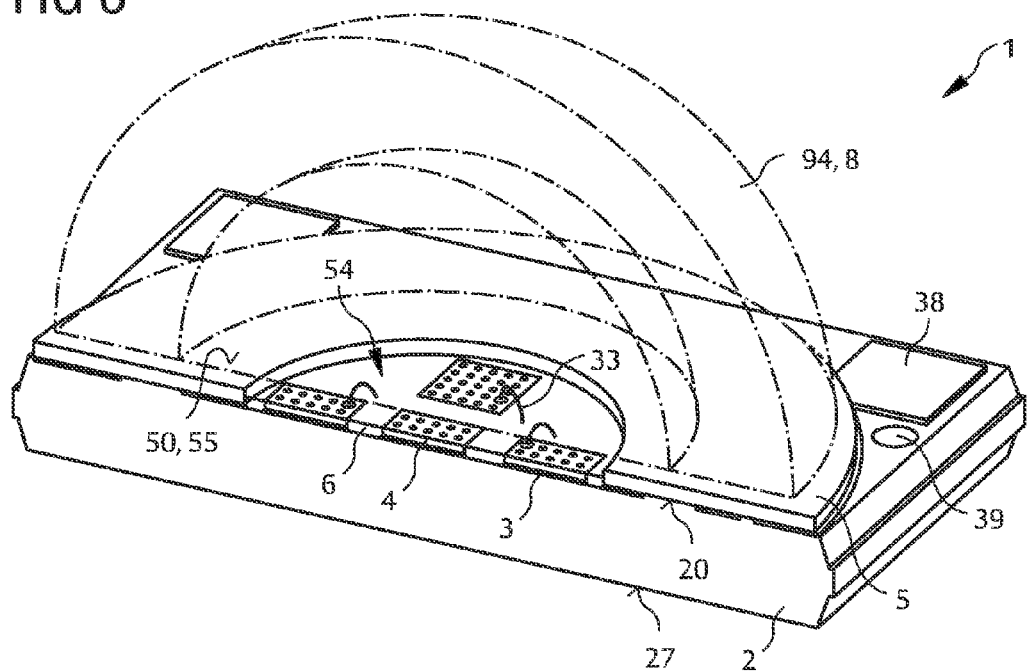

In the case of the exemplary embodiment of the semiconductor component 1 as shown in FIG. 3, the chip carrier 2 is formed by a metal core board provided with conductor tracks in particular on both sides. At the chip mounting side 20, a plurality of the semiconductor chips 4 are adhesively bonded and wire-contacted. The semiconductor chips 4 are surrounded all around by the filling 6 that appears white and are embedded into the filling 6. A solder resist (not illustrated) is optionally present for optical adjustment during fitting of the component carriers 5.

Furthermore, one or a plurality of electrical contact areas 38, for example, soldering pads, for external electrical contacting of the semiconductor component 1 are situated at the chip carrier 2. For fixing the semiconductor component 1, the chip carrier 2 preferably comprises fixing devices 39, by means of which the semiconductor component 1 can be screwed onto an external carrier, for example. In the exemplary embodiment in accordance with FIG. 3, the component part which mechanically carries and supports the semiconductor component 1 is the chip carrier 2, which is in particular an aluminum metal core board having a thickness of approximately 1.1 mm.

The component carrier 5 is designed as a round disk in which the circular cutout 54 is shaped. The optical component part 94, which can be a conversion medium body 8 or else a lens, is fitted on the component carrier 5. If the optical component part 94 is simultaneously designed as a conversion medium body 8, then the conversion medium body 8 has, for example, a high scattering proportion, for instance of at least 40% or of at least 50%. By means of the conversion medium body 8, a high proportion of the radiation is then reflected back to the top side 50 of the component carrier 5. With the use of such a scattering conversion medium body 8, a light coupling-out efficiency of the semiconductor component 1 can be increased by means of the reflective coating 55. The optical component part 94 is embodied in a domed fashion and is spaced apart from the chip carrier 2, the semiconductor chips 4 and the filling 6.

Figure 4:
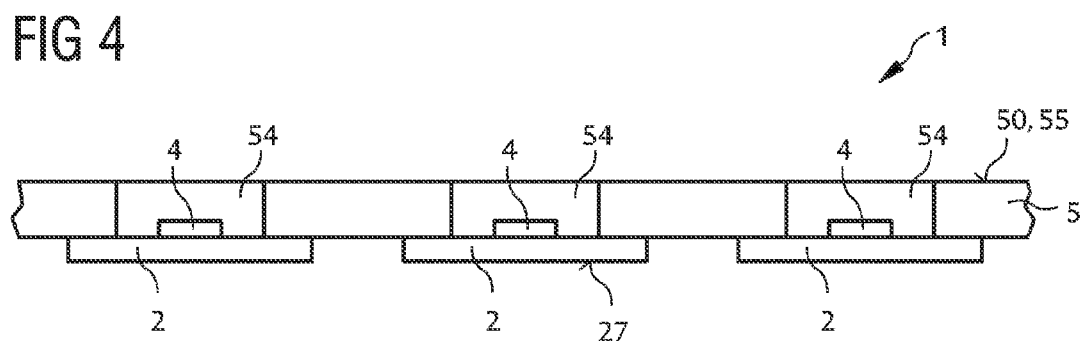

In the exemplary embodiment as indicated in FIG. 4, the semiconductor component 1 comprises a plurality of the chip carriers 2, onto each of which, for example, one of the semiconductor chips 4 is fitted. One of the cutouts 54 is assigned to each of the chip carriers 2.

Figure 5:
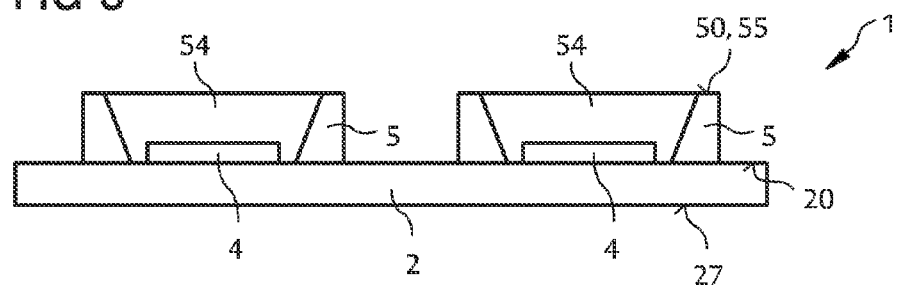

In accordance with FIG. 5, a plurality of component carriers 5 are fitted on the chip carrier 2. The component carriers 5 have oblique side surfaces in the cutout 54, for example, in order to serve beam shaping of the radiation emitted by the semiconductor chip 4. Such oblique side surfaces can also be present in all the other exemplary embodiments. In contrast to the illustration shown, it is also possible for the component carrier 5 to be embodied integrally and/or for the semiconductor chips 4 to project from the cutout 54, in a departure from the illustration in FIG. 5.

A filling or optical component parts 91, 92, 93, 94, as shown in association with FIGS. 2 and 3, can also be present in the exemplary embodiments in FIGS. 1, 4 and/or 5.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor component comprising:
   a chip carrier having electrical contact devices;
   an optoelectronic semiconductor chip that is designed for generating radiation and which is mechanically and electrically fitted on the chip carrier; and
   a component carrier, the chip carrier being fixed to the component carrier;
   wherein the semiconductor chip is located in a cutout of the component carrier;
   wherein the component carrier is electrically insulated from the chip carrier and the semiconductor chip;
   wherein the component carrier is shaped from a metal or a metal alloy and is provided with a reflective coating at a top side facing away from the chip carrier;
   wherein the component carrier projects beyond the chip carrier, as seen in a plan view of the top side; and
   wherein the component carrier is larger than the chip carrier by at least a factor of 1.5.

2. The optoelectronic semiconductor component according to claim 1, wherein the component carrier, in a direction away from the chip carrier, projects beyond the semiconductor chip and surrounds it all around as seen in a plan view of the top side.

3. The optoelectronic semiconductor component according to claim 1, wherein the chip carrier is a circuit board or a metal core board.

4. The optoelectronic semiconductor component according to claim 3, wherein the semiconductor chip is fitted directly to the chip carrier and no additional reflective layer is located between the semiconductor chip and the chip carrier.

5. The optoelectronic semiconductor component according to claim 1, wherein the component carrier is adhesively bonded onto the chip carrier and wherein the component carrier and the chip carrier do not mutually penetrate through one another or intermesh in one another.

6. The optoelectronic semiconductor component according to claim 1, wherein a thickness of the component carrier is between 100 μm and 500 μm inclusive.

7. The optoelectronic semiconductor component according to claim 1, wherein exactly one semiconductor chip is situated in the cutout of the component carrier and wherein a side wall of the cutout is circumferentially at a distance of at most 150 μm from the semiconductor chip.

8. The optoelectronic semiconductor component according to claim 1, which comprises a plurality of the chip carriers and only one component carrier, each chip carrier having a semiconductor chip and being fitted to the one component carrier, wherein the chip carriers are mechanically connected to one another via the component carrier.

9. The optoelectronic semiconductor component according to claim 8, wherein the chip carriers within the semiconductor component are electrically connected to one another.

10. The optoelectronic semiconductor component according to claim 1, wherein the cutout in which the semiconductor chip is located is at least partly filled with a filling, such that side surfaces of the semiconductor chip facing the component carrier and side surfaces of the component carrier facing the semiconductor chip are at least partly covered by the filling.

11. The optoelectronic semiconductor component according to claim 10, wherein the filling is radiation-nontransmissive and reflective and extends in a direction away from the chip carrier at least as far as half of the semiconductor chip.

12. The optoelectronic semiconductor component according to claim 1, wherein the electrical contact device comprises a conductor track located between the chip carrier and the component carrier.

13. The optoelectronic semiconductor component according to claim 1, further comprising a plug for an external electrical connection, wherein the plug is located at a side of the chip carrier facing away from the component carrier.

14. The optoelectronic semiconductor component according to claim 1, wherein the part of the optoelectronic semiconductor component that carries the semiconductor component is the component carrier.

15. The optoelectronic semiconductor component according to claim 1, wherein the part of the optoelectronic semiconductor component that carries the semiconductor component is the chip carrier.

16. An optoelectronic semiconductor component comprising:
   a chip carrier having electrical contact devices;
   an optoelectronic semiconductor chip that is designed for generating radiation and which is mechanically and electrically fitted on the chip carrier; and
   a component carrier, the chip carrier being fixed to the component carrier;
   wherein the semiconductor chip is located in a cutout of the component carrier;
   wherein the component carrier is electrically insulated from the chip carrier and the semiconductor chip,
   wherein the component carrier is shaped from a metal or a metal alloy and is provided with a reflective coating at a top side facing away from the chip carrier;
   wherein a side wall of the cutout is at a distance of at most 150 μm from the semiconductor chip;
   wherein the cutout is at least partly filled with a filling, such that side surfaces of the semiconductor chip facing the component carrier and side surfaces of the component carrier facing the semiconductor chip are at least partly covered by the filling; and
   wherein the filling is radiation-nontransmissive and reflective and extends in a direction away from the chip carrier at least as far as half of the semiconductor chip.

17. An optoelectronic semiconductor component comprising:
   a chip carrier having electrical contact devices;
   an optoelectronic semiconductor chip that is designed for generating radiation and that is mechanically and electrically fitted on the chip carrier; and
   a component carrier, the chip carrier is fixed to the component carrier;
   wherein the semiconductor chip is located in a cutout of the component carrier;
   wherein the component carrier is electrically insulated from the chip carrier and the semiconductor chip; and
   the component carrier is shaped from a metal or a metal alloy and is provided with a reflective coating at a top side facing away from the chip carrier.

* * * * *